United States Patent
Qi et al.

(10) Patent No.: US 11,984,546 B2
(45) Date of Patent: May 14, 2024

(54) METHOD FOR MANUFACTURING SIDE WIRE FOR SUBSTRATE AND SUBSTRATE STRUCTURE

(71) Applicants: BEIJING BOE DISPLAY TECHNOLOGY CO., LTD., Beijing (CN); BOE TECHNOLOGY GROUP CO., LTD., Beijing (CN)

(72) Inventors: Yonglian Qi, Beijing (CN); Lianjie Qu, Beijing (CN); Shan Zhang, Beijing (CN); Hebin Zhao, Beijing (CN); Xiaoling Xu, Beijing (CN); Guangdong Shi, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 668 days.

(21) Appl. No.: 17/256,084

(22) PCT Filed: Apr. 10, 2020

(86) PCT No.: PCT/CN2020/084176
§ 371 (c)(1),
(2) Date: Dec. 24, 2020

(87) PCT Pub. No.: WO2020/207465
PCT Pub. Date: Oct. 15, 2020

(65) Prior Publication Data
US 2021/0193896 A1    Jun. 24, 2021

(30) Foreign Application Priority Data
Apr. 10, 2019   (CN) .......................... 201910285864.5

(51) Int. Cl.
H01L 33/62   (2010.01)
H05K 1/02    (2006.01)
H05K 3/06    (2006.01)

(52) U.S. Cl.
CPC ............. *H01L 33/62* (2013.01); *H05K 1/028* (2013.01); *H05K 3/06* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 6,014,809 A | 1/2000 | Sebesta | |
| 2006/0109394 A1* | 5/2006 | Miyagawa | H05K 3/361 349/149 |

(Continued)

FOREIGN PATENT DOCUMENTS

| | | |
|---|---|---|
| CN | 1241285 A | 1/2000 |
| CN | 1685286 A | 10/2005 |

(Continued)

OTHER PUBLICATIONS

First Office Action dated Dec. 4, 2019 for application No. CN201910285864.5 with English translation attached.

(Continued)

*Primary Examiner* — Nishath Yasmeen
(74) *Attorney, Agent, or Firm* — Nath, Goldberg & Meyer; Joshua B. Goldberg

(57) ABSTRACT

A method for manufacturing a side wire for a substrate and a substrate structure are provided. The method includes: forming a plurality of first pattern structures on a side surface of the substrate, wherein a gap between any adjacent two of the plurality of first pattern structures connects a top surface and a bottom surface of the substrate to each other;

(Continued)

forming a conductive material film covering the side surface of the substrate; and removing the plurality of first pattern structures and a portion of the conductive material film that is attached on the plurality of first pattern structures, and maintaining a portion of the conductive material film that is located between any adjacent two of the plurality of first pattern structures as the side wire.

16 Claims, 2 Drawing Sheets

(56) References Cited

U.S. PATENT DOCUMENTS

| | | | |
|---|---|---|---|
| 2014/0087090 A1* | 3/2014 | Miyagawa | H01L 21/0272 427/560 |
| 2017/0192574 A1* | 7/2017 | Koike | G06F 3/047 |

FOREIGN PATENT DOCUMENTS

| | | |
|---|---|---|
| CN | 102020241 A | 4/2011 |
| CN | 102747320 A | 10/2012 |
| CN | 106465537 A | 2/2017 |
| CN | 107416765 A | 12/2017 |
| CN | 107424682 A | 12/2017 |
| CN | 109963409 A | 7/2019 |
| EP | 1022120 A2 | 7/2000 |

OTHER PUBLICATIONS

First Office Action dated Jun. 15, 2020 for application No. CN201910285864.5 with English translation attached.
First Office Action dated Sep. 16, 2020 for application No. CN201910285864.5 with English translation attached.

* cited by examiner

METHOD FOR MANUFACTURING SIDE WIRE FOR SUBSTRATE AND SUBSTRATE STRUCTURE

CROSS REFERENCE TO RELATED APPLICATIONS

This is a National Phase Application filed under 35 U.S.C. 371 as a national stage of PCT/CN2020/084176, filed Apr. 10, 2020, an application which claims the priority of Chinese patent application No. 201910285864.5, filed on Apr. 10, 2019, the content of each which is incorporated herein by reference in its entirety.

TECHNICAL FIELD

The present disclosure relates to the field of display technologies, and in particular to a method for manufacturing a side wire for a substrate and a substrate structure.

BACKGROUND

A structure of a relevant micro light emitting diode (Micro LED) display substrate may include: a substrate, an array of Micro LEDs arranged on a top surface of the substrate, and a flexible printed circuit board bound on a bottom surface of the substrate. A line on the top surface of the substrate is connected to a line on the bottom surface of the substrate via a line on a side surface of the substrate. Typically, a length-to-width ratio (i.e., aspect ratio) of the side surface of the substrate is relatively large and a width of the side surface of the substrate is relatively small, and thus it is not suitable for forming a line on the side surface of the substrate by using a process such as a photolithography process.

SUMMARY

Embodiments of the present disclosure provide a method for manufacturing a side wire for a substrate and a substrate structure.

According to a first aspect of the present disclosure, there is provided a method for manufacturing a side wire for a substrate, the method including:

Forming a plurality of first pattern structures on a side surface of the substrate, wherein a gap between any adjacent two of the plurality of first pattern structures connects a top surface and a bottom surface of the substrate to each other;

Forming a conductive material film covering the side surface of the substrate; and Removing the plurality of first pattern structures and a portion of the conductive material film attached on the plurality of first pattern structures, and maintaining a portion of the conductive material film located between any adjacent two of the plurality of first pattern structures as the side wire.

In an embodiment, the forming a plurality of first pattern structures on a side surface of the substrate includes:

Forming a plurality of first pattern preliminary structures on the side surface of the substrate by using a predetermined ink, wherein a gap between any adjacent two of the plurality of first pattern preliminary structures connects the top surface and the bottom surface of the substrate to each other, and the predetermined ink includes a first solvent and a self-assembly material; and Removing the first solvent in the predetermined ink to cause the self-assembly material to combine into a unitary structure so as to obtain the plurality of first pattern structures.

In an embodiment, the removing the plurality of first pattern structures and a portion of the conductive material film attached on the plurality of first pattern structures includes: removing the self-assembly material by using a second solvent.

In an embodiment, both ends of each of the plurality of first pattern structures extend to an edge region of the top surface of the substrate and an edge region of the bottom surface of the substrate, respectively, and both ends of the portion of the conductive material film located between any adjacent two of the first pattern structures extend to the edge region of the top surface of the substrate and the edge region of the bottom surface of the substrate, respectively.

In an embodiment, the self-assembly material includes colloidal microspheres, and the colloidal microspheres include polystyrene microspheres.

In an embodiment, a mass percentage of the colloidal microspheres in the predetermined ink is between 5% and 30%.

In an embodiment, the removing the first solvent in the predetermined ink to cause the self-assembly material to combine into a unitary structure includes:

Evaporating the first solvent to cause the colloidal microspheres to be attached to the substrate; and Drying the colloidal microspheres at a preset temperature to combine the colloidal microspheres into the unitary structure.

In an embodiment, the forming a plurality of first pattern preliminary structures on the side surface of the substrate by using a predetermined ink includes: letting the predetermined ink on the substrate stand still for a preset time.

In an embodiment, prior to forming the plurality of first pattern structures, the method further includes:

Attaching protective films onto the top surface and the bottom surface of the substrate, respectively, wherein a boundary of the protective film on the top surface of the substrate is in contact with an outer contour of the edge region of the top surface of the substrate, and a boundary of the protective film on the bottom surface of the substrate is in contact with an outer contour of the edge region of the bottom surface of the substrate, respectively.

In an embodiment, the side wire has a generally U-shape, and an opening of the U-shape is directed toward the side surface of the substrate on which the plurality of first pattern structures are formed.

In an embodiment, a diameter of each of the polystyrene microspheres is between 50 nm and 300 nm.

In an embodiment, the self-assembly material includes polystyrene microspheres, and the preset time is between 2 mins and 10 mins.

In an embodiment, the first solvent is selected from a group consisting of carbon tetrachloride, dichloroethane, chloroform, tetrahydrofuran, nitrobenzene, toluene, and carbon disulfide.

In an embodiment, the self-assembly material is dissolved in the second solvent.

In an embodiment, the second solvent is trichlorotoluene.

In an embodiment, the conductive material film is formed by a process of local sputtering or a process of printing a metal paste.

In an embodiment, each of the plurality of first pattern structures has a strip shape, and a thickness of the conductive material film is smaller than a thickness of each of the plurality of first pattern structures.

According to a second aspect of the present disclosure, there is provided a substrate structure, which is manufactured by the method according to any one of the embodiments of the first aspect of the present disclosure.

According to a third aspect of the present disclosure, there is provided a substrate structure, including: a substrate; and a side wire on a side surface of the substrate. Both ends of the side wire extend to an edge region of a top surface of the substrate and an edge region of a bottom surface of the substrate, respectively.

In an embodiment, the side wire has a substantially U-shape, and an opening of the U-shape is directed toward the side surface of the substrate.

DETAILED DESCRIPTION

To enable one of ordinary skill in the art to better understand technical solutions of the present disclosure, the present disclosure will be further described in detail below with reference to the accompanying drawings and exemplary embodiments.

The inventors of the present inventive concept have found that, in the related art, a wire (or a conductive line) is formed directly on a side of a substrate typically by using a transfer printing method. However, the wire formed by using the transfer printing method generally has a nonuniform thickness and is prone to breakage.

Embodiments of the present disclosure provide a method for manufacturing a side wire (i.e., side conductive line) 12 on a side surface of a substrate 1, and the method may include the following steps S11 to S13, as shown in FIGS. 1 to 5.

Figure 3:
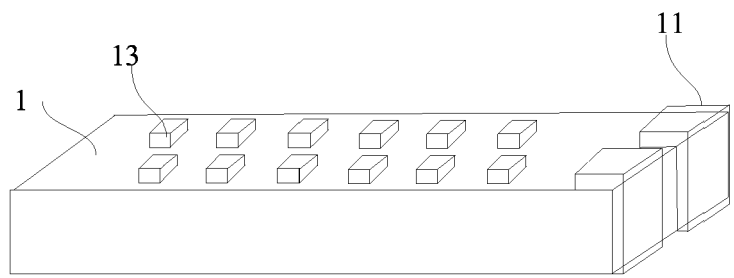
FIG. 3 is a schematic structural view of an intermediate state of a method for manufacturing a side wire for a substrate according to an embodiment of the present disclosure.

Firstly, in step S11, a plurality of first pattern structures 11 are formed on a side surface of the substrate 1 (e.g., a right side surface of the substrate 1 as shown in FIG. 3). For example, each of the plurality of first pattern structures 11 has a strip shape (e.g., each of a portion of each first pattern structure 11 on the top surface of the substrate 1, a portion of the first pattern structure 11 on the side surface of the substrate 1, and a portion of each first pattern structure 11 on the bottom surface of the substrate 1 may have a strip shape), and a gap between any adjacent two of the plurality of first pattern structures 11 connects the top surface (e.g., the upper surface in FIG. 3) and the bottom surface (e.g., the lower surface in FIG. 3) of the substrate 1 together. A material of each of the plurality of first pattern structures 11 should be a material that can be removed in a subsequent process. Each of the plurality of first pattern structures 11 is located at a position where the side wire 12 is not desired to be formed. The position of the gap between any adjacent two of the plurality of first pattern structures 11 is a position where it is desired to form the side wire 12. For example, each of the plurality of first pattern structures 11 covers a portion of the top surface of the substrate 1, a portion of the side surface (e.g., the right side surface in FIG. 3) of the substrate 1, and a portion of the bottom surface of the substrate 1. In other words, each of the plurality of first pattern structures 11 has a substantially U-shape (e.g., an orthogonal projection of each of the plurality of first pattern structures 11 on a plane perpendicular to the side surface of the substrate 1 on which the first pattern structure 11 is located has a substantially U-shape), and an opening of the U-shape is proximal to (or directed to) the side surface of the substrate 1 on which the plurality of first pattern structures 11 are formed. Each of the portions of each first pattern structure 11 located on the top surface of the substrate 1, on the side surface of the substrate 1, and on the bottom surface of the substrate 1 may be a parallelogram (e.g., a rectangle). However, the present disclosure is not limited thereto, it is feasible as long as each of the plurality of first pattern structures 11 covers a portion of the top surface of the substrate 1, a portion of a side surface (e.g., the right side surface in FIG. 3) of the substrate 1, and a portion of the bottom surface of the substrate 1, and has a uniform thickness (i.e., a size in a direction perpendicular to the side surface or the top surface of the substrate 1). Further, an aspect ratio of each of the plurality of first pattern structures 11 is not particularly limited. Further, a distance between any adjacent two of the plurality of first pattern structures 11 may be equal to a width of the side wire 12 to be formed between the adjacent two of the plurality of first pattern structures 11.

Then, in step S12, a conductive material film is formed on the side surface to cover the side surface. For example, a large portion of the conductive material film is located in the gap between any adjacent two of the plurality of first pattern structures 11, and a small portion of the conductive material film is attached on the adjacent two of the plurality of first pattern structures 11. It should be noted that, a thickness of the conductive material film should be at least smaller than the thickness of each of the adjacent two of the plurality of first pattern structures 11, such that the conductive material in the gap between any adjacent two of the plurality of first pattern structures 11 and the conductive material on the adjacent two of the plurality of first pattern structures 11 are not connected together, thereby facilitating the formation of the final side wire 12. In order to prevent the conductive material in the gap between any adjacent two of the plurality of first pattern structures 11 and the conductive material on the adjacent two of the plurality of first pattern structures 11 from being connected to each other, one of ordinary skill in the art may determine a difference between the thickness of the conductive material film and the thickness of each first pattern structure 11 by an experiment in advance.

Finally, in step S13, the plurality of first pattern structures 11 and the portions of the conductive material film that are attached to the plurality of first pattern structures 11 are removed from the substrate 1, and the portions of the conductive material film that are located between any adjacent two of the plurality of first pattern structures 11 are maintained on the substrate 1 as side wires 12. As each of the plurality of first pattern structures 11 is removed, the portion of the conductive material film attached onto each of the first pattern structures 11 is also removed together therewith. The portion of the conductive material film between any adjacent two of the plurality of first pattern structures 11 is left to form the side wire 12 on the side surface of the substrate 1.

In the prior art, a transfer printing process is generally used to manufacture a conductive material film on a side surface of a substrate, and a thickness of the manufactured conductive material film has poor uniformity. In the method of the present disclosure, for example, the conductive material film is manufactured by using a process of local sputtering or a process of printing a metal paste, and the quality of the manufactured entire conductive material film is higher than that of a conductive material film formed by using the transfer printing process. Thus, the quality of the side wire 12 formed by the remaining conductive material film is also better than that of a side wire formed by using the transfer printing process.

Figure 1:
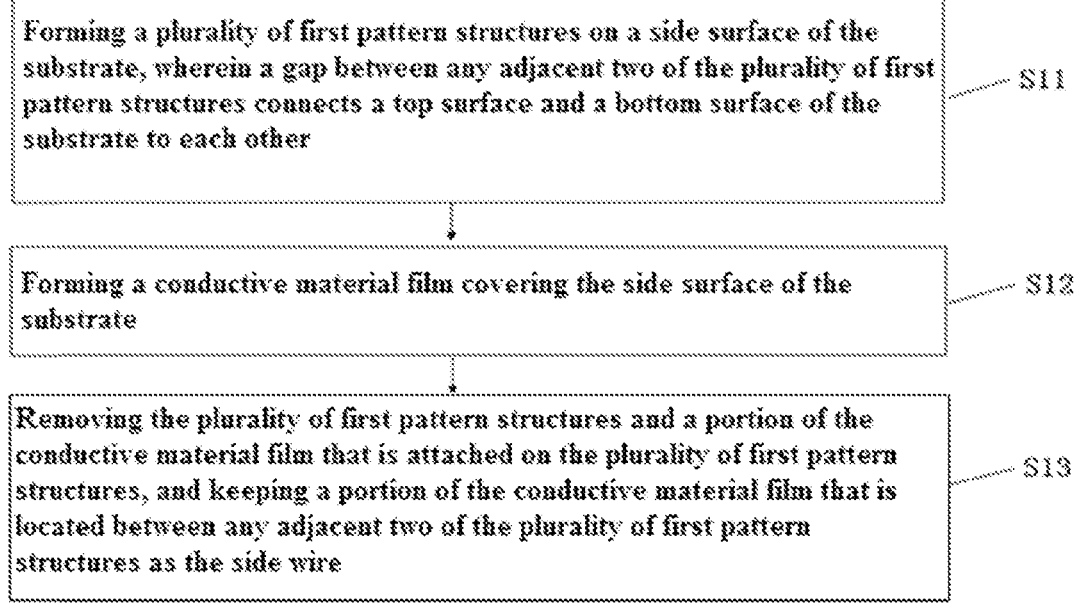
FIG. 1 is a schematic flowchart of a method for manufacturing a side wire for a substrate according to an embodiment of the present disclosure.
Figure 2:
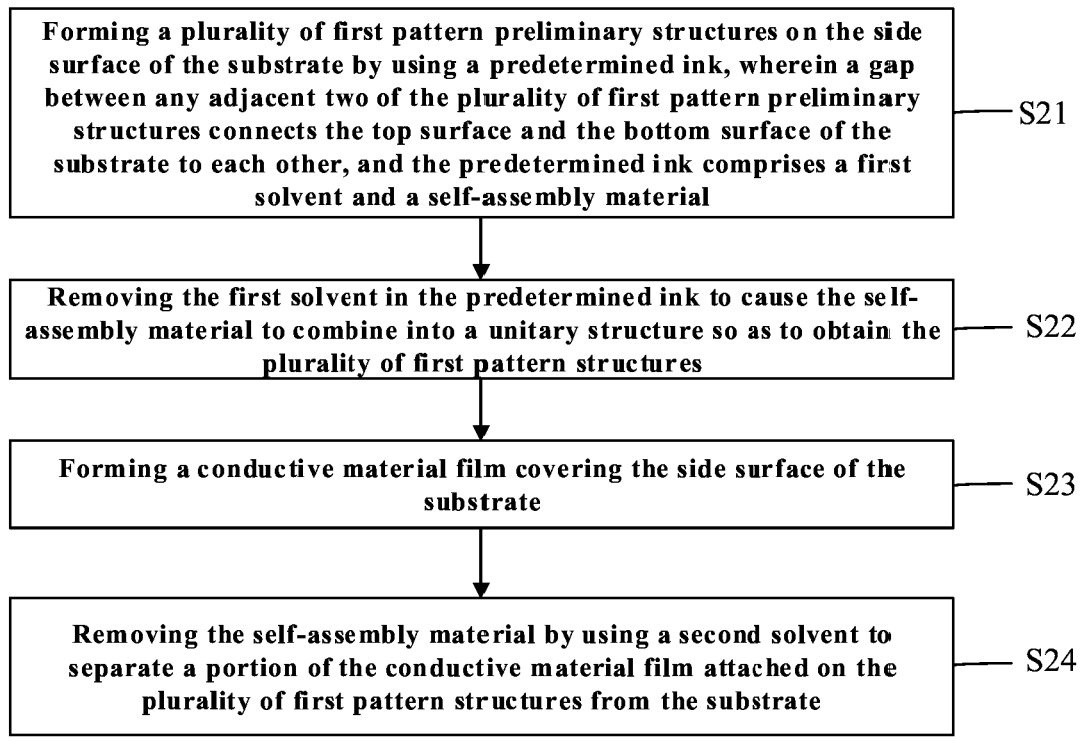
FIG. 2 is a schematic flowchart of an example of a method for manufacturing a side wire for a substrate according to an embodiment of the present disclosure.

FIG. 2 illustrates an example method of the method illustrated in FIG. 1, and the example method may include the following steps S21 to S24.

In step S21, a plurality of first pattern preliminary structures are formed on the side surface of the substrate 1 using a predetermined ink, to form a gap between any adjacent two of the first pattern preliminary structures that connects the top surface and the bottom surface of the substrate 1 to each other, and the predetermined ink includes a first solvent and a self-assembly material.

For example, the plurality of first pattern preliminary structures may be formed by using an existing transfer printing process. Each of the plurality of first pattern preliminary structures is processed into a first pattern structure 11 in a subsequent step. Since each first pattern structure 11 will be finally removed, the requirement on a thickness uniformity and integrity of each first pattern preliminary structure in this step is not high.

The self-assembly material may be polystyrene microspheres. In this case the first solvent may be any one selected from carbon tetrachloride, dichloroethane, chloroform, tetrahydrofuran, nitrobenzene, toluene and carbon disulfide, and for example may be carbon tetrachloride.

In order to stabilize a state of each of the plurality of first pattern preliminary structures, each of the plurality of first pattern preliminary structures may be left to stand still (or may be let stand still) for a preset time (e.g., the preset time may be one as described below).

In step S22, the first solvent in the predetermined ink is removed and the self-assembly material is combined into a unitary structure (i.e., a one-piece structure) to obtain the plurality of first pattern structures 11. The purpose of step S22 is to bring each of the plurality of first pattern preliminary structures into a stable and coherent solid state.

For example, step S22 may include: rapidly evaporating the first solvent to attach colloidal microspheres in the first solvent to the substrate 1, and then drying the colloidal microspheres at a preset temperature (e.g., in a range from 23 degrees Celsius to 40 degrees Celsius) to combine the colloidal microspheres into the unitary structure. For example, the colloidal microspheres are dried to form colloidal crystals. The resulted substrate structure formed in step S22 is shown in FIG. 3.

In step S23, a conductive material film is formed on the side surface (i.e., the side surface on which the plurality of first pattern structures 11 are formed) of the substrate 1 so as to cover the side surface. The conductive material film is, for example, a metal film, and the thickness of the metal film may be controlled to be between 2 μm and 6 μm. For example, the metal film may be a silver (Ag) film.

In step S24, the self-assembly material is removed by using a second solvent and the portions of the conductive material film attached on the plurality of first pattern structures 11 are separated from the substrate 1. In the case where the self-assembly material is polystyrene microspheres, the second solvent may be trichlorotoluene. For example, the second solvent and the self-assembly material may undergo a dissolution reaction (i.e., the self-assembly material may be dissolved in the second solvent). The resulted substrate structure formed in this step is shown in FIG. 4.

Figure 4:
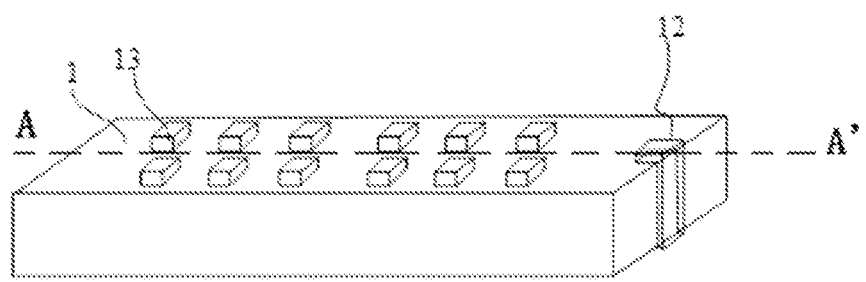
FIG. 4 is a schematic structural view of a finished stage of a method for manufacturing a side wire for a substrate according to an embodiment of the present disclosure.
Figure 5:
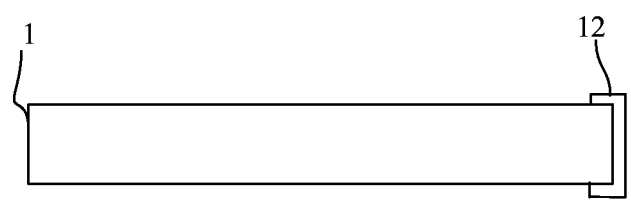
FIG. 5 is a schematic cross-sectional view of the substrate structure shown in FIG. 4 taken along line AA'.

FIG. 5 is a schematic cross-sectional view of the substrate structure shown in FIG. 4 taken along line AA'. As shown in FIG. 5, each of the plurality of first pattern structures 11 covers a portion of the top surface of the substrate 1, a portion of the side surface (e.g., the right side surface in FIG. 5) of the substrate 1, and a portion of the bottom surface of the substrate 1. In other words, each of the plurality of first pattern structures 11 has a substantially U-shape, and an opening of the U-shape is directed toward the side surface of the substrate 1 on which the plurality of first pattern structures 11 are formed. Each of a portion of each first pattern structure 11 located on the top surface of the substrate 1, a portion of the first pattern structure 11 located on the side surface of the substrate 1, and a portion of the first pattern structure 11 located on the bottom surface of the substrate 1 may have a shape of parallelogram (e.g., a shape of rectangle).

In the above embodiments, the self-assembly material may have three properties: being capable of being in a form of an ink, being capable of being incorporated into a stable, unitary solid structure, and being capable of being removed by a solvent after being incorporated into the stable, unitary solid structure.

Based on the above, one type of material that may be selected as the self-assembly material is colloidal microspheres.

Specifically, the colloidal microspheres may be, for example, polystyrene microspheres. A diameter of each of the polystyrene microspheres may be selected to be 50 nm to 300 nm. In the case of adopting the polystyrene microspheres, a stand-still time of each of the plurality of first pattern structures 11 is, for example, between 2 mins and 10 mins.

It should be noted that a mass percentage of the colloidal microspheres in the predetermined ink is between 5% and 30% (e.g., may be further between 5% and 20%). If the mass percentage of the colloidal microspheres is too small, each of the plurality of first pattern structures 11 formed is too thin to separate a portion of the conductive material to be removed from a portion of the conductive material to be remained. If the mass percentage of the colloidal microspheres is too large, it may not be advantageous to form a predetermined pattern from the predetermined ink by using a process such as the transfer printing.

For example, as shown in FIGS. 4 and 5, both ends of each of the plurality of first pattern structures 11 extend to an edge region of the top surface and an edge region of the bottom surface of the substrate 1, respectively, and both ends of a portion of the conductive material film located between any adjacent two of first pattern structures 11 extend to the edge region of the top surface and the edge region of the bottom surface of the substrate 1, respectively. For example, both ends of the portion (i.e., the side wire 12) of the conductive material film between any adjacent two of the plurality of first pattern structures 11 are respectively flush with both ends of another portion (i.e., another side wire 12) adjacent to the portion. For example, the side wire 12 shown in FIG. 4 may be formed between the adjacent two first pattern structures 11 shown in FIG. 3, an end of the side wire 12 on the top surface of the substrate 1 may be flush with (e.g., aligned with) an end of any one of the adjacent two first pattern structures 11 on the top surface of the substrate 1, and an end of the side wire 12 on the bottom surface of the substrate 1 may be flush with (e.g., aligned with) an end of any one of the adjacent two first pattern structures 11 on the bottom surface of the substrate 1. That is, the gap between any adjacent two of the plurality of first pattern structures 11 also extends to the top surface and the bottom surface of the substrate 1, such that the side wire 12 formed in a subsequent step also extends to the top surface and the bottom surface of the substrate 1. The portion of the side wire 12 extending to the top surface of the substrate 1 may be used for electrically connecting to the Micro LEDs 13 (or connecting to a driving circuit of the Micro LEDs 13), and the portion of the side wire 12 extending to the bottom surface of the substrate 1 may be used for electrically connecting a structure such as a flexible printed circuit board (FPC) or the like.

Figure 6:
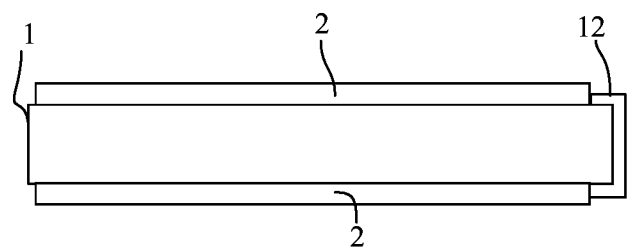
FIG. 6 is a schematic diagram showing that protective films are provided on the top and bottom surfaces of the substrate structure shown in FIG. 5, respectively.

It should be noted that, when the side wires 12 located on the side surface of the substrate 1 are manufactured, some circuit structures (e.g., the Micro LEDs 13) are already arranged on the top surface or the bottom surface of the substrate 1 in some cases. In these cases, the manufacturing method may further include, before forming the first pattern structures 11: attaching protective films 2 onto the top and bottom surfaces of the substrate 1, respectively, such that boundaries of the protective films 2 on the top and bottom surfaces of the substrate 1 are in contact with outer contours of the edge regions of the top and bottom surfaces of the substrate 1, respectively, as shown in FIG. 6. That is, the boundary of the protective film 2 is the boundary of the portion of each side wire 12 extending to the bottom surface or the boundary of the portion of each side wire 12 extending to the top surface. In other words, each of the protective films 2 may be located on a portion of the top surface or bottom surface of the substrate 1 that is not covered by the plurality of first pattern structures 11. That is, one end of each protective film 2 may be in contact with one end of each side wire 12 (and/or one end of each first pattern structure 11), as shown in FIG. 6. Apparently, the protective films 2 should be removable (e.g., peelable) in a subsequent process.

It should be noted that, some lines (not shown) are usually formed on both the top surface and the bottom surface of the substrate 1 before the side wires 12 of the substrate 1 are formed. The side wires 12 may be required to be electrically connected to these existing lines, whether the side wires 12 are provided only on the side surfaces of the substrate 1 or are provided to further extend to the top and/or bottom surface of the substrate 1. Although only one side wire 12 is shown in the drawings, actually the number of the side wires 12 is not limited to one. Further, a length of each side wire 12 extending on the top surface or the bottom surface of the substrate 1 may be adjusted according to actual requirements. Each of the side wires 12 may have a substantially U-shape, and an opening of the U-shape may be directed toward the side surface of the substrate 1 on which the plurality of first pattern structures 11 are formed.

Each of the side wires manufactured by the method according to the above embodiments of the present disclosure has a uniform thickness and is not easily to be broken, thereby improving the reliability and the performance of the resulting substrate structure.

The embodiments of the present disclosure further provide a substrate structure manufactured by the manufacturing method according to the above-described embodiments of the present disclosure.

As shown in FIGS. 4 and 5, the substrate structure may include the substrate 1 and a side wire 12 located at a side surface of the substrate 1. Both ends of the side wire 12 extend onto the edge region of the top surface and the edge region of the bottom surface of the substrate 1, respectively. The side wire 12 has a substantially U-shape with an opening proximal to (i.e., directed toward) the side of the substrate 1.

Compared with the prior art, the thickness of the side wire 12 of the substrate structure has an improved uniformity, and defects such as breakage of the side wire 12 are reduced.

It should be understood that the above embodiments are merely exemplary embodiments adopted to illustrate the principles of the present disclosure, and the present disclosure is not limited thereto. It will be apparent to one of ordinary skill in the art that various changes and modifications may be made without departing from the scope of the present disclosure as defined in the appended claims, and such changes and modifications also fall within the scope of the present disclosure.

What is claimed is:

1. A method for manufacturing a side wire for a substrate, comprising:

forming a plurality of first pattern structures on a side surface of the substrate, wherein a gap between any adjacent two of the plurality of first pattern structures connects a top surface and a bottom surface of the substrate to each other;

forming a conductive material film covering the side surface of the substrate; and removing the plurality of first pattern structures and a portion of the conductive material film attached on the plurality of first pattern structures, and maintaining a portion of the conductive material film located between any adjacent two of the plurality of first pattern structures as the side wire, wherein the forming a plurality of first pattern structures on a side surface of the substrate comprises:

forming a plurality of first pattern preliminary structures on the side surface of the substrate by using a predetermined ink, wherein a gap between any adjacent two of the plurality of first pattern preliminary structures connects the top surface and the bottom surface of the substrate to each other, and the predetermined ink comprises a first solvent and a self-assembly material; and removing the first solvent in the predetermined ink to cause the self-assembly material to combine into a unitary structure so as to obtain the plurality of first pattern structures.

2. The method according to claim 1, wherein the removing the plurality of first pattern structures and a portion of the conductive material film attached on the plurality of first pattern structures comprises: removing the self-assembly material by using a second solvent.

3. The method according to claim 1, wherein both ends of each of the plurality of first pattern structures extend to an edge region of the top surface of the substrate and an edge region of the bottom surface of the substrate, respectively, and both ends of the portion of the conductive material film located between any adjacent two of the first pattern structures extend to the edge region of the top surface of the substrate and the edge region of the bottom surface of the substrate, respectively.

4. The method according to claim 1, wherein the self-assembly material comprises colloidal microspheres, and the colloidal microspheres comprise polystyrene microspheres.

5. The method according to claim 4, wherein a mass percentage of the colloidal microspheres in the predetermined ink is between 5% and 30%.

6. The method according to claim 4, wherein the removing the first solvent in the predetermined ink to cause the self-assembly material to combine into a unitary structure comprises:
  evaporating the first solvent to cause the colloidal microspheres to be attached to the substrate; and
  drying the colloidal microspheres at a preset temperature to combine the colloidal microspheres into the unitary structure.

7. The method according to claim 1, wherein the forming a plurality of first pattern preliminary structures on the side surface of the substrate by using a predetermined ink comprises: letting the predetermined ink on the substrate stand still for a preset time.

8. The method according to claim 3, wherein prior to forming the plurality of first pattern structures, the method further comprises:
  attaching protective films onto the top surface and the bottom surface of the substrate, respectively, wherein a boundary of the protective film on the top surface of the substrate is in contact with an outer contour of the edge region of the top surface of the substrate, and a boundary of the protective film on the bottom surface of the substrate is in contact with an outer contour of the edge region of the bottom surface of the substrate, respectively.

9. The method according to claim 3, wherein the side wire has a generally U-shape, and an opening of the U-shape is directed toward the side surface of the substrate on which the plurality of first pattern structures are formed.

10. The method according to claim 4, wherein a diameter of each of the polystyrene microspheres is between 50 nm and 300 nm.

11. The method according to claim 7, wherein the self-assembly material comprises polystyrene microspheres, and the preset time is between 2 mins and 10 mins.

12. The method according to claim 1, wherein the first solvent is selected from a group consisting of carbon tetrachloride, dichloroethane, chloroform, tetrahydrofuran, nitrobenzene, toluene, and carbon disulfide.

13. The method according to claim 2, wherein the self-assembly material is dissolved in the second solvent.

14. The method according to claim 13, wherein the second solvent is trichlorotoluene.

15. The method according to claim 1, wherein the conductive material film is formed by a process of local sputtering or a process of printing a metal paste.

16. The method according to claim 1, wherein each of the plurality of first pattern structures has a strip shape, and a thickness of the conductive material film is smaller than a thickness of each of the plurality of first pattern structures.

* * * * *